United States Patent
Waldron et al.

(10) Patent No.: US 9,601,488 B2
(45) Date of Patent: Mar. 21, 2017

(54) GATE-ALL-AROUND SEMICONDUCTOR DEVICE AND METHOD OF FABRICATING THE SAME

(71) Applicant: IMEC VZW, Leuven (BE)

(72) Inventors: Niamh Waldron, Leuven (BE); Clement Merckling, Evere (BE); Nadine Collaert, Blanden (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 15/138,056

(22) Filed: Apr. 25, 2016

(65) Prior Publication Data
US 2016/0240532 A1    Aug. 18, 2016

Related U.S. Application Data

(62) Division of application No. 14/671,134, filed on Mar. 27, 2015, now Pat. No. 9,324,818.

(30) Foreign Application Priority Data

Mar. 27, 2014  (EP) ..................................... 14162027

(51) Int. Cl.
*H01L 29/41*  (2006.01)
*H01L 27/088*  (2006.01)
(Continued)

(52) U.S. Cl.
CPC .......... *H01L 27/0886* (2013.01); *B82Y 10/00* (2013.01); *B82Y 40/00* (2013.01); *H01L 29/04* (2013.01); *H01L 29/0649* (2013.01); *H01L 29/0673* (2013.01); *H01L 29/0676* (2013.01); *H01L 29/1079* (2013.01);
(Continued)

(58) Field of Classification Search
CPC ............... H01L 29/413; H01L 29/7853; H01L 29/6681; H01L 29/42392; H01L 29/04; H01L 29/1079; H01L 29/775; H01L 29/66469; H01L 29/0673; H01L 29/20; H01L 29/0649; B82Y 10/00; B82Y 40/00
See application file for complete search history.

(56) References Cited

U.S. PATENT DOCUMENTS 8,399,879 B2   3/2013   Liu et al.
8,618,556 B2   12/2013  Wu et al.
(Continued)

OTHER PUBLICATIONS

Conrad et. al., "Performance and Variability Studies of InGaAs Gate-all-Around Nanowire MOSFETs," *IEEE Transactions on Device and Materials Reliability*, vol. 13, No. 4, pp. 489,496, Dec. 2013.
(Continued)

*Primary Examiner* — David Vu
(74) *Attorney, Agent, or Firm* — Knobbe, Martens, Olson & Bear LLP

(57) ABSTRACT

The disclosed technology generally relates to semiconductor devices and more particularly to a gate-all-around semiconductor device, and methods of fabricating the same. In one aspect, the method comprises providing on a semiconductor substrate between STI regions at least one suspended nanostructure anchored by a source region and a drain region. The suspended nanostructure is formed of a crystalline semiconductor material that is different from a crystalline semiconductor material of the semiconductor substrate. A gate stack surrounds the at least one suspended nanostructure.

20 Claims, 16 Drawing Sheets

(51) Int. Cl.
  *B82Y 10/00* (2011.01)
  *B82Y 40/00* (2011.01)
  *H01L 29/66* (2006.01)
  *H01L 29/775* (2006.01)
  *H01L 29/06* (2006.01)
  *H01L 29/10* (2006.01)
  *H01L 29/20* (2006.01)
  *H01L 29/04* (2006.01)
  *H01L 29/423* (2006.01)
  *H01L 29/78* (2006.01)
  *H01L 29/40* (2006.01)
  *H01L 21/02* (2006.01)

(52) U.S. Cl.
  CPC ............ *H01L 29/20* (2013.01); *H01L 29/401* (2013.01); *H01L 29/413* (2013.01); *H01L 29/42392* (2013.01); *H01L 29/6681* (2013.01); *H01L 29/66469* (2013.01); *H01L 29/775* (2013.01); *H01L 29/7853* (2013.01); *H01L 21/0262* (2013.01); *H01L 21/02381* (2013.01); *H01L 21/02538* (2013.01); *H01L 21/02579* (2013.01); *H01L 21/02639* (2013.01)

(56) References Cited

U.S. PATENT DOCUMENTS

2010/0295022 A1    11/2010   Chang et al.
2013/0234147 A1     9/2013   Wu et al.

OTHER PUBLICATIONS

Gu et. al,, "III-V Gate-all-around Nanowire MOSFET Process Technology: From 3D to 4D", *IEDM Tech. Dig 529* (2012).

Gu et. al., "First Experimental Demonstration of Gate-all-around III-V MOSFETs by Top-down Approach", *IEDM Tech. Dig. 769* (2011).

GATE-ALL-AROUND SEMICONDUCTOR DEVICE AND METHOD OF FABRICATING THE SAME

CROSS-REFERENCE TO RELATED APPLICATIONS

This application is a divisional of U.S. patent application Ser. No. 14/671,134, filed Mar. 27, 2015, now U.S. Pat. No. 9,324,818, which claims foreign priority to European application EP 14162027.8, filed Mar. 27, 2014. Each of the above applications is incorporated herein by reference in its entirety.

BACKGROUND

Field

The disclosed technology generally relates to a semiconductor device, and particularly to a gate-all-around (GAA) semiconductor device, and more particularly to a gate-all-around (GAA) nanostructure semiconductor device. The disclosed technology also relates to methods of manufacturing the same.

Description of the Related Technology

High mobility materials such as III-V semiconductor materials have drawn attention for utilization in scaling complementary metal-oxide-semiconductor (CMOS) technology at advanced technology nodes, e.g., technology nodes at 10 nm and beyond. In order to meet various technological specifications at these advanced technology nodes, e.g., specifications associated with short channel effects (SCE) such as sub-threshold slope and drain-induced barrier lowering, various multi-gate transistor structures have been proposed, e.g., tri-gate quantum well structures and gate-all-around/nanowire (GAA/NW) structures.

III-V GAA devices fabricated by growing blanket layers on an entire III-V wafer (typically 2" or 4" substrates) have been reported, as for example disclosed in "First experimental demonstration of gate-all-around III-V MOSFETs by top-down approach", by Gu et al. as published in IEEE IEDM 2011 pp. 769-772. In this example, after growing, the blanket heterostructure layers are patterned and a sacrificial buffer layer is removed by means of a wet etch to release the nanowire.

However, integrating these structures at the very large scale integration (VLSI) level, e.g., on 300 mm or larger wafers, poses a considerable technical challenge. Moreover, to be economically competitive, the III-V materials should be monolithically integrated with Si, in order to minimize cost by utilizing as much of the existing Si-based semiconductor processing techniques as possible. The use of Si as a substrate would also enable the integration of several functional blocks on the same platform, such as for example logic, high-frequency, and I/O circuitry.

SUMMARY OF CERTAIN INVENTIVE ASPECTS

A first aspect relates to a method for manufacturing a gate-all-around (GAA) semiconductor device.

A second aspect relates to a gate-all-around (GAA) semiconductor device.

It is an aim of the present disclosure to provide for a gate-all-around (GAA) semiconductor device and a method for manufacturing such gate-all-around (GAA) semiconductor device, which is compatible with current and future technology nodes (1X technology nodes and below) wherein III-V channel materials are integrated with semiconductor based substrates (preferably Si-based substrates).

A method for manufacturing a gate-all-around (GAA) semiconductor device is disclosed, the method comprising the steps of providing a semiconductor substrate of a first crystalline semiconductor material; forming shallow trench isolation (STI) regions in the semiconductor substrate; forming a plurality of semiconductor fins on the semiconductor substrate; the plurality of semiconductor fins comprising a second crystalline semiconductor material on the first crystalline semiconductor material, the second crystalline semiconductor material being lattice mismatched to the first crystalline semiconductor material, each one of the plurality of semiconductor fins being formed between pairs of STI regions wherein the plurality of semiconductor fins are isolated from each other by the STI regions, the plurality of semiconductor fins and the STI regions abutting on a common planar top surface; providing at least one nanostructure of a third crystalline semiconductor material on the second crystalline semiconductor material of each one of the plurality of semiconductor fins; providing on the at least nanostructure a source and a drain region at both sides of the sacrificial gate; removing the sacrificial gate and thereafter removing the second crystalline semiconductor material thereby suspending the at least one nanostructure being anchored by the source and drain region; providing a final gate stack around the at least one nanostructure after removing the second crystalline semiconductor material.

The first crystalline semiconductor material preferably comprises silicon. The second crystalline semiconductor material preferably comprises a Group III-V material. The third crystalline semiconductor material preferably comprises another Group III-V material different from the Group IThV material of the second crystalline semiconductor material.

According to embodiments of the first aspect providing at least one nanostructure includes providing only one nanostructure.

According to embodiments of the first aspect providing at least one nanostructure includes providing two separated nanostructures on each one of the plurality of semiconductor fins.

According to embodiments of the first aspect providing only one nanostructure comprises epitaxial growing the third crystalline semiconductor material on the second crystalline semiconductor material of each one of the plurality of semiconductor fins. The only one nanostructure has a pyramidal faceted shape due to the epitaxial growth.

According to embodiments of the first aspect providing two nanostructures comprises from a top surface of each fin, providing two separate recesses or gaps in the second crystalline semiconductor material at the interfaces of the semiconductor fins and the STI regions on opposite sides of the semiconductor fin; epitaxially growing the third crystalline semiconductor material in the recesses or gaps on the second crystalline semiconductor material; planarizing the third crystalline semiconductor material thereby revealing two separate nanostructures of the third crystalline semiconductor material in the recesses.

According to embodiments of the first aspect providing two separate recesses or gaps comprises performing a thermal treatment of the second crystalline semiconductor material. The thermal treatment is preferably done at a temperature between 500 and 600 degrees Celsius. The two recesses or gaps are created by faceting of the second semiconductor material.

According to embodiments of the first aspect the two nanostructures are at a distance D from each other wherein D is larger than the thickness of the final gate stack and is smaller than the width of the semiconductor fin.

According to embodiments of the first aspect removing the second crystalline semiconductor material is done by etching.

According to embodiments of the first aspect forming semiconductor fins comprises epitaxial growing the second crystalline semiconductor material on the first crystalline semiconductor material in between the STI regions using ART.

According to embodiments of the first aspect the method further comprises before removing the second crystalline semiconductor material, etching a top part of the STI regions such that a level of a respective top surface of the STI regions becomes lower than a level of a respective top surface of the semiconductor fins.

According to a second aspect, a gate-all-around (GAA) semiconductor device is disclosed comprising a semiconductor substrate comprising a first crystalline semiconductor material; at least one suspended nanostructure being located at least partially above and in between a pair of adjacent STI regions and the at least one suspended nanostructure being held in place by a source region and a drain region at both ends of the at least one suspended nanostructure, the at least one suspended nanostructure comprising a third crystalline semiconductor material which is different from the first crystalline semiconductor material, wherein a cavity is present between the at least one suspended nanostructure, opposite sidewalls of the STI regions and a top surface portion of the semiconductor substrate, the top surface portion extending between the pair of STI regions, wherein the suspended nanostructure is wrapped by a final gate stack and wherein the top surface and the sidewalls of the STI regions and the exposed surface of the semiconductor substrate from the cavity are also covered by the final gate stack.

The first crystalline semiconductor material is preferably Si and the third crystalline semiconductor material comprises preferably a Group III-V material.

According to embodiments of the second aspect, the at least one nanostructure includes only one suspended nanostructure with a width substantially equal to the width of the cavity.

According to embodiments of the second aspect the at least one nanostructure consists of one suspended nanostructure with a pyramidal faceted shape.

According to embodiments of the second aspect the at least one nanostructure consists of two suspended nanostructures at a distance D from each other, wherein D is larger than the thickness of the final gate stack and is smaller than the width of the cavity.

According to embodiments of the second aspect the suspended nanostructures have a width below 10 nm, preferably between 2 nm and 10 nm.

It is an advantage of embodiments of the present disclosure that III-V on Si GAA devices may be manufactured using a full wafer approach, i.e. using wafer of at least 300 mm (or 12 inch) wafer size.

It is an advantage of embodiments of the present disclosure that III-V materials may be integrated on Si without the use of expensive and small III-V wafers and/or without the use of expensive and thick strain relaxed buffer (SRB)-based substrates. It is thus an advantage of embodiments of the present disclosure that the method for forming III-V GAA semiconductor devices is less expensive than methods as known for a person skilled in the art.

It is an advantage of embodiments of the present disclosure that III-V semiconductor device may be provided with a better electrostatic control and threshold voltage (Vt) control by substrate bias.

It is an advantage of embodiments of the present invention that very narrow nanostructures may be formed (i.e. smaller than 10 nm) without the need for etching.

BRIEF DESCRIPTION OF THE DRAWINGS

The disclosure will be further elucidated by means of the following description and the appended figures.

Figure 1:
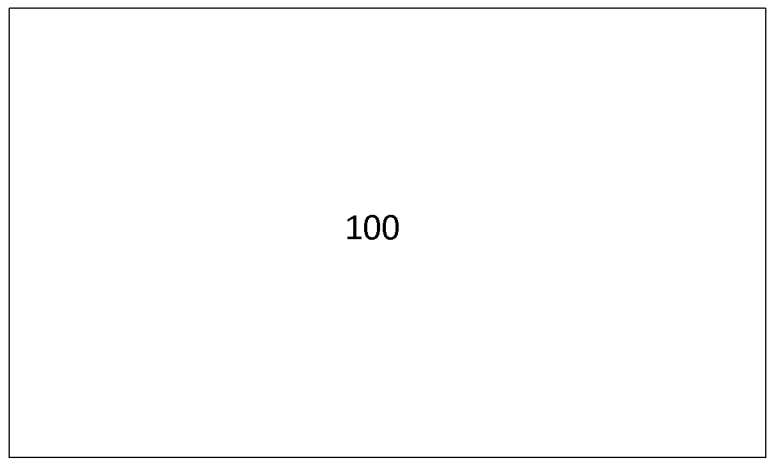
FIGS. 1 to 6 schematically illustrate intermediate semiconductor structures at various different processing stages according to a method of manufacturing a gate-all-around semiconductor device comprising one nanostructure, according to embodiments of the present disclosure.

The drawings are only schematic and are non-limiting. In the drawings, the size of some of the elements may be exaggerated and not drawn on scale for illustrative purposes. The dimensions and the relative dimensions do not necessarily correspond to actual reductions to practice of the invention.

Any reference signs in the claims shall not be construed as limiting the scope.

In the different drawings, the same reference signs refer to the same or analogous elements.

DETAILED DESCRIPTION OF CERTAIN ILLUSTRATIVE EMBODIMENTS

The disclosure will be further elucidated by means of the following detailed description of several embodiments of the disclosure and the appended figures.

In the following detailed description, numerous specific details are set forth in order to provide a thorough understanding of the disclosure and how it may be practiced in particular embodiments. However, it will be understood that the present disclosure may be practiced without these specific details. In other instances, well-known methods, procedures and techniques have not been described in detail, so as not to obscure the present disclosure. While the present disclosure will be described with respect to particular embodiments and with reference to certain drawings, the disclosure is not limited hereto. The drawings included and described herein are schematic and are not limiting the scope of the disclosure. It is also noted that in the drawings, the size of some elements may be exaggerated and, therefore, not drawn to scale for illustrative purposes.

The term "comprising", used in the claims, should not be interpreted as being restricted to the means listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B.

III-V materials have attracted much interest as a potential high mobility channel material for use in semiconductor transistors at advanced scaling nodes (e.g., 10 nm node and beyond). However, due to low effective mass and density of states (DOS), InGaAs-based channel devices are expected to suffer from worse short channel effects (SCE) compared to Si. This makes the gate-all-around (GAA) architecture very interesting for transistors based on III-V materials, as transistors having the GAA architecture can provide a relatively higher level of electrostatic control, e.g., channel control, compared to transistors having planar or fin field effect transistor (FinFET) architectures at comparable technological node. InGaAs GAA transistors fabricated on small InP substrates show very promising results.

As used herein, a nanostructure refers to a structure having a cross-sectional dimension, e.g., a minimum cross-sectional dimension, such as a diameter, a height or/and a width, that is less than about 20 nm, for example less than about 10 nm. An example of a nanostructure may be an elongated nanostructure such as a nanowire.

Referring to FIG. 1, a semiconductor substrate 100 comprising a first crystalline semiconductor material is provided. The substrate 100 may be, e.g., a bulk silicon (Si) wafer, a bulk germanium (Ge) wafer, a semiconductor-on-insulator (SOI) substrate such as for example Si—O—I or Ge—O—I substrate, or a strained semiconductor-on-insulator (SSOI) substrate, among other suitable substrates. The semiconductor substrate 100 comprises or consists of a first crystalline semiconductor material. The first crystalline semiconductor material can be chosen from a group IV element such as Si or Ge.

Figure 2:
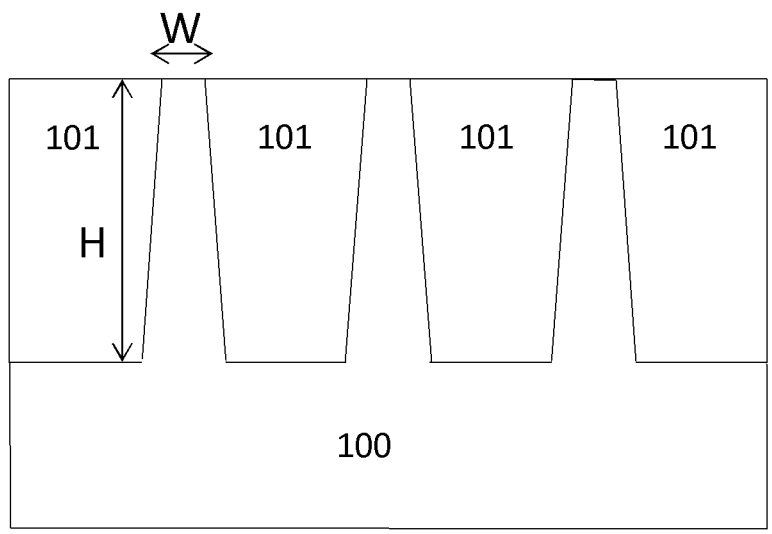

Referring to FIG. 2, shallow trench isolation (STI) regions 101 are formed in the semiconductor substrate 100. The STI regions 101 may be formed by etching trenches and filling the trenches with an insulating material such as for example an oxide ($SiO_2$). The STI regions 101 define the active regions which will be formed in between subsequent (neighbouring) STI regions 101.

In some embodiments, the STI regions 101 have a depth (H) between about 100 nm and about 500 nm and a width between about 500 nm and about 20 nm. In other embodiments, e.g., for more advanced STI processes, the depth (H) of the STI region can even be below 100 nm and the width of the STI region can be down to 5 nm. In various embodiments, the aspect ratio (defined herein as the ratio between the depth and the width) of the STI regions is at least 2, e.g., between about 2 and 100, between about 5 and 100 or between about 25 and 100.

Figure 3:
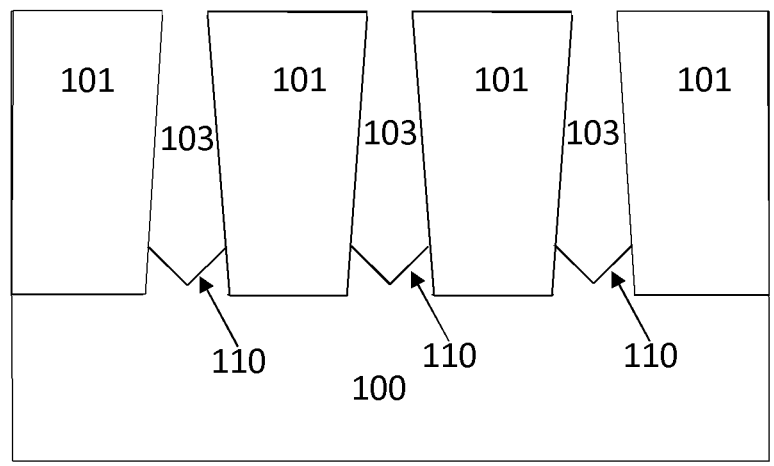
Figure 4:
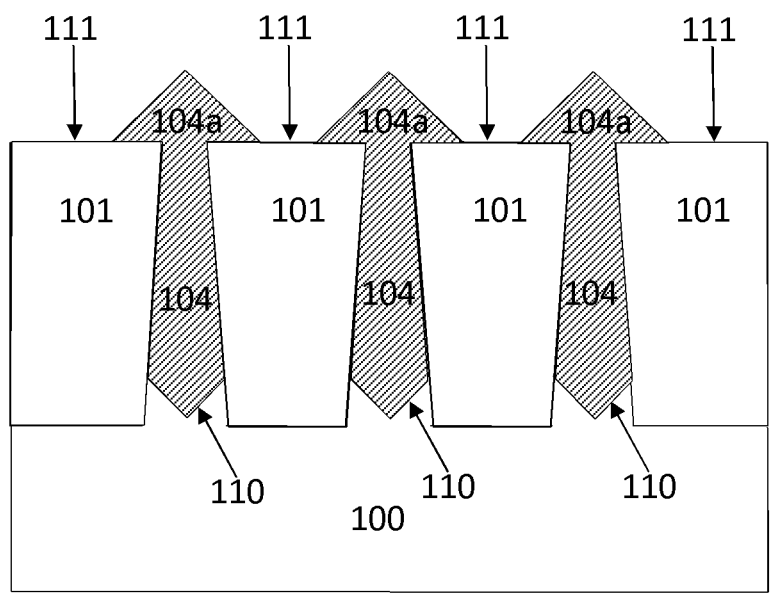
Figure 5:
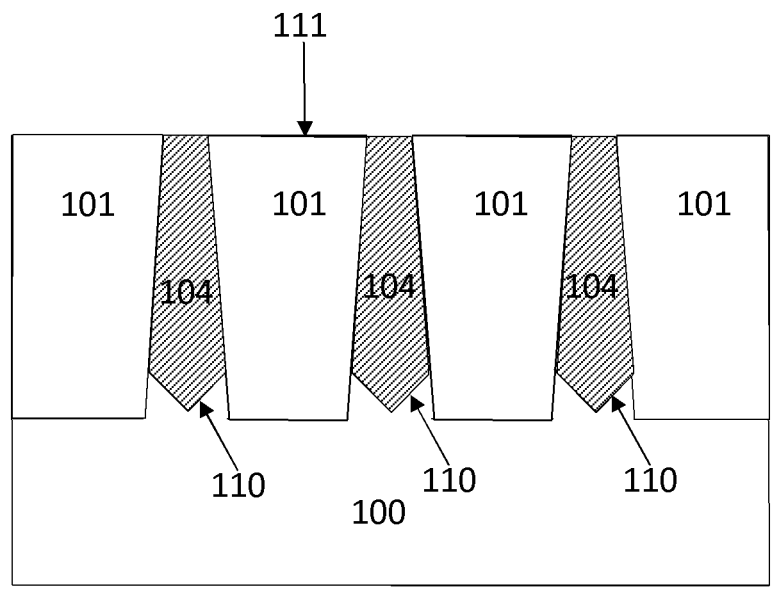

Referring to FIGS. 3 to 5, after forming the STI regions 101, semiconductor fins or lines 104 are formed.

Referring to FIG. 3, at least upper portions the first crystalline semiconductor material of the semiconductor substrate 100 between adjacent pairs of STI regions 101 is removed, thereby forming recesses 103, wherein each recess is formed between the adjacent pairs of STI regions 101. In the illustrated embodiment, each recess 103 has a recessed bottom surface 110 formed of the exposed first crystalline semiconductor material, and side surfaces formed of the insulating material of the STI regions 101. The recessed surface 110 may have a different shape depending on the etching chemistry which is used to remove the first crystalline semiconductor material. For example, the recessed surface 110 may have etch pits having crystal facets, e.g., inverted pyramidal facets, associated with the particular etchant and first semiconductor material combination. In some embodiments, an anisotropic etching chemistry having an etch selectivity having a higher etch rate of the first crystalline semiconductor material compared to the insulator material of the STI regions 101 is used, thereby substantially not removing the insulating material of the STI regions 101 while forming the recess 103. It will be appreciated that the recesses 103 may be formed by wet etching or dry etching techniques. An example of a wet etch chemistry that can be used include a solution containing tetramethylammonium hydroxide (TMAH) and/or hydrochloric acid (HCl). An example of a dry etch chemistry that can be used include a vapor comprising HCl vapor and/or $SF_6$. In some embodiments, both wet and dry techniques can be employed to remove different portions of the first crystalline semiconductor material.

Referring to FIG. 4, a second crystalline semiconductor material 104 is provided on the first crystalline semiconducting material in between the STI regions 101 in the recesses 103. The second crystalline material 104 is lattice mismatched to the first crystalline semiconducting material. In some embodiments, the lattice-mismatched second crystalline material 104 is strained without undergoing substantial relaxation of the strain created by the lattice mismatch, such that the lattice constant of the second crystalline semiconducting material 104 is about the same as the lattice constant of the first crystalline semiconducting material. In other embodiments, the lattice-mismatched second crystalline material 104 is substantially strain-relaxed such that its lattice constant is about the same as the lattice constant of a bulk material of the second crystalline semiconducting material. The second crystalline material 104 is preferably a high energy bandgap material. The high energy bandgap material is preferably a group III-V material such as for example InP, AlAs, GaAs, GaP, InAs, GaSb, AlSb or the like or a combination thereof such as ternary compounds made thereof (for example InGaAs, InGaP). In some embodiments, the second crystalline semiconductor material 104 is grown, e.g., epitaxially grown, on the first crystalline semiconductor material 100, starting from the recessed surfaces 110 between the STI regions 101. In various embodiments, the second semiconductor material 104 may be selective epitaxially grown, such that the second semiconductor material is grown on the recessed surfaces 110, while not being formed on the sidewall surfaces formed of the insulating material of the STI regions 101. As shown in FIG. 4, the second crystalline semiconductor material 104 may also grow above 104a the top surfaces 111 of the STI regions 101. Overgrowth of the second crystalline semiconductor material 104a may be planarized using chemical mechanical polishing (CMP).

Referring to FIG. 5, after CMP, the semiconductor fins comprising the second crystalline semiconductor material 104 and the abutting adjacent STI regions 101 form a common planar top surface 111 (FIG. 5).

In embodiments, the fins may be rectangular parallelepiped structure having a width, a length and a height, wherein the width and the length are parallel to the substrate and the height is perpendicular to the substrate. In some embodiments, the width remains substantially equal along the height of the fin. For example, the widths at the top of the fin and the bottom or the base of the fin are within e.g., about 10%, about 5% or about 1% of the base width. The bottom of base of the fin is part of the fin closest to the substrate. The top of the fin is at the opposite side of the bottom of the fin.

In other embodiments, the fins may be tapered (as shown in the Figures). A width at the top of the fin is slightly shorter than the width at the bottom or the base of the fin. For example, the width at the top of the fin may be within e.g., about 20%, about 10% or about 5% of the base width.

Figure 15:
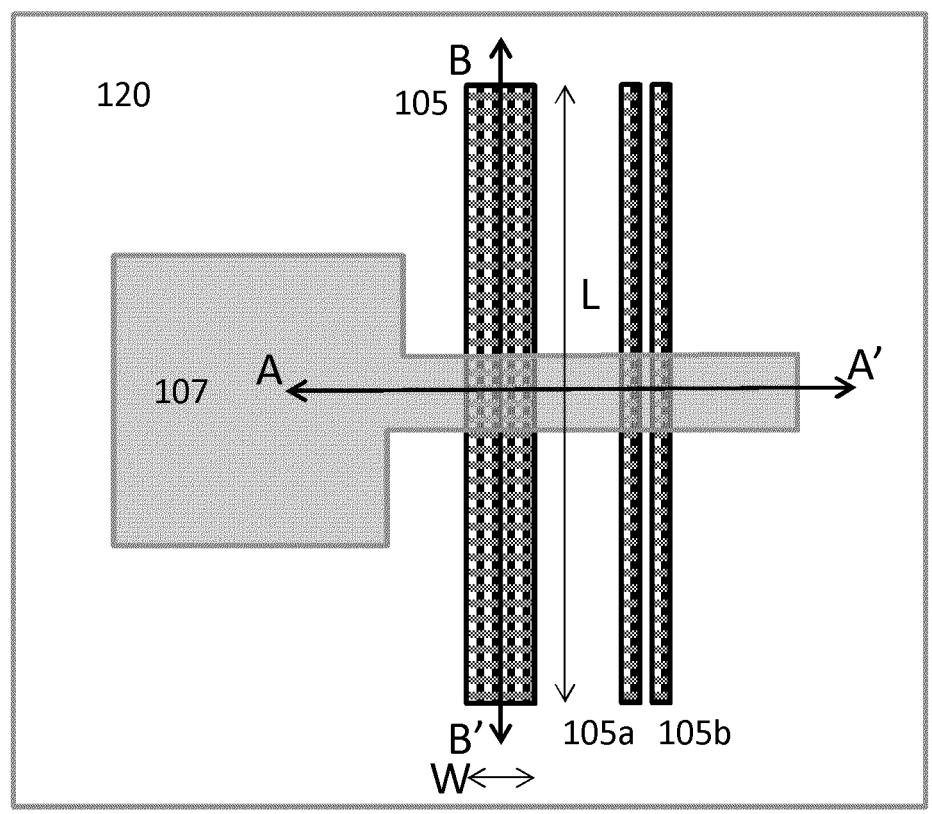
FIG. 15 schematically illustrates a top view of an intermediate structure of a gate-all-around semiconductor device at a processing stage, according to a method for manufacturing a gate-all-around semiconductor device comprising at least one nanostructure, according to embodiments of the present disclosure.

These semiconductor fins or lines 104 have a height equal to the height (H) of the STI regions 101 and a width W ranging between about 100 nm and about 50 nm, between about 50 nm and about 20 nm, or between about 20 nm and about 5 nm. In various embodiments, the aspect ratio (defined herein as the ratio between the depth and the width) of the fins is at least 2. The semiconductor fins or lines 104 are elongated and lying in a same plane as the common planar top surface (FIG. 15). The length L of the semiconductor fins or lines may be several nm's, preferably much larger than the width of the fin, for example 10 times larger. In various embodiments, the aspect ratio of the fins is between about 2 and 100, between about 5 and 100 or between about 25 and 100.

The structure with semiconductor fins or lines in between and isolated by the STI regions is also often referred to as a STI template structure.

Figure 6:
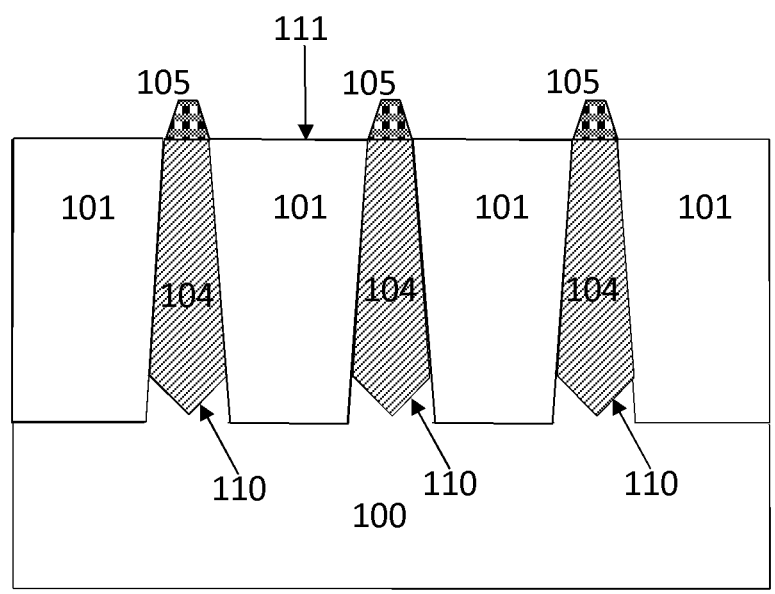
Figure 7:
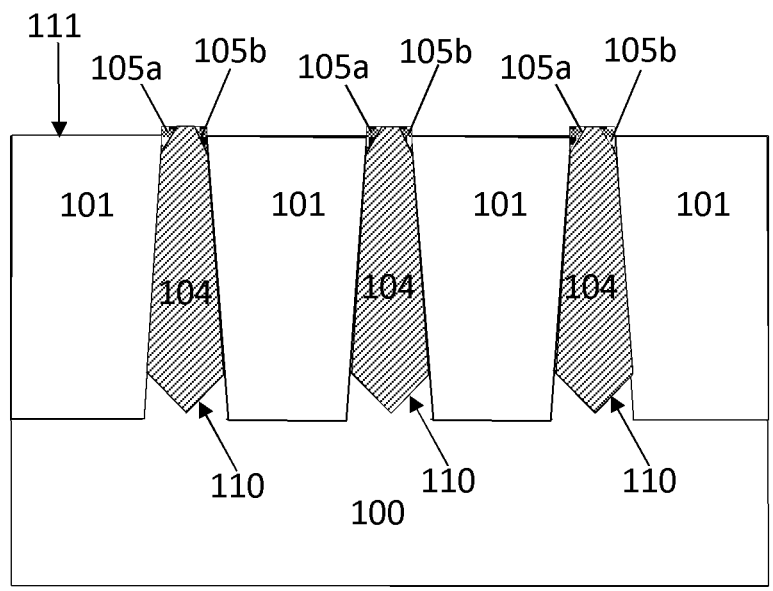
FIGS. 7 to 10 and FIG. 14 schematically illustrate intermediate semiconductor structures at various different processing stages according a method of manufacturing a gate-all-around semiconductor device comprising two nanostructures, according to embodiments of the present disclosure.
Figure 8:
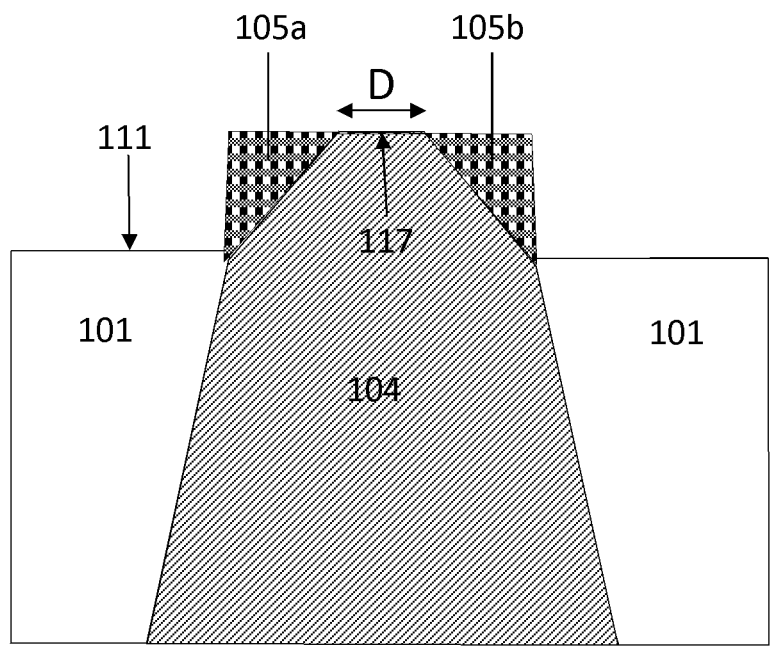

Referring to FIGS. 6 and 7, at least one nanostructure 105, 105a, 105b formed of a third crystalline semiconductor material is formed on the second crystalline semiconductor material of the semiconductor fins 104. In some embodiments, one nanostructure 105 may be provided on the semiconductor fin 104, as illustrated in FIG. 6, while in other embodiments, a plurality of nanostructures, e.g., two nanostructures 105a, 105b, may be provided on the semiconductor fin 104, as illustrated in FIG. 7. As shown in FIG. 8 illustrating in an enlarged partial view of the top part of a fin 104 shown in FIG. 7, the two nanostructures 105a, 105b are separated from each other over a distance D. Distance D is shorter than the width of the semiconductor fin, for example shorter than about half of the width of the semiconductor fin. For example, the distance D may be range between about 50 nm and about 20 nm, between about 25 nm and about 10 nm, or between about 10 nm and about 2.5 nm The third crystalline semiconductor material of the at least one nanostructure 105, 105a, 105b comprises a high energy bandgap material, e.g., a group III-V material InP, AlAs, GaAs, GaP, InAs, GaSb, AlSb or the like or a combination thereof such as ternary compounds made thereof (for example InGaAs, InGaP), which is different than the second crystalline semiconductor material in at least the atomic percentages of the elements and has a higher band gap. When the second crystalline semiconductor material and the third crystalline semiconductor material are formed of the same alloy system, the atomic ratios of the elements are different between the second and third crystalline semiconductor materials such that the band gap of the third crystalline semiconductor material is higher than that of the second crystalline semiconductor material.

In some embodiments, the nanostructure 105 (FIG. 6) or the nanostructures 105a/105b (FIG. 8), as formed on the semiconductor fin 104, are strained without substantially being strain-relaxed. In some other embodiments, the nanostructure 105 (FIG. 6) or the nanostructures 105a/105b (FIG. 8), as formed on the semiconductor fin 104, are substantially strain-relaxed.

It will be appreciated that the nanostructure 105 or the nanostructures 105/105b can be referred to as lateral nanostructure(s), which refer to nanostructures that are elongated, e.g., during fabrication, along a plane that is parallel to the substrate top surface and/or the top surface of the STI regions 101. A lateral nanostructure is distinguishable from nanostructures that may be referred to as vertical nanostructures, which refer to nanostructures that are elongated, e.g., during fabrication, vertically along an axis that is perpendicular to the substrate top surface and/or the top surface of the STI regions 101.

In embodiments where one nanostructure 105 is provided (FIG. 6), the nanostructure 105 formed of the third crystalline semiconductor material may be epitaxially grown on the second crystalline semiconductor material of the semiconductor fins 104. The third crystalline semiconductor material is thus grown above the common top surface 111 on the second crystalline semiconductor material between adjacent STI regions 101. The shape of the nanostructure 105 may vary depending on the growth conditions. For example, the nanostructure may have a shape having a plurality of <111> facet, e.g., a pyramidal shape.

Figure 9:
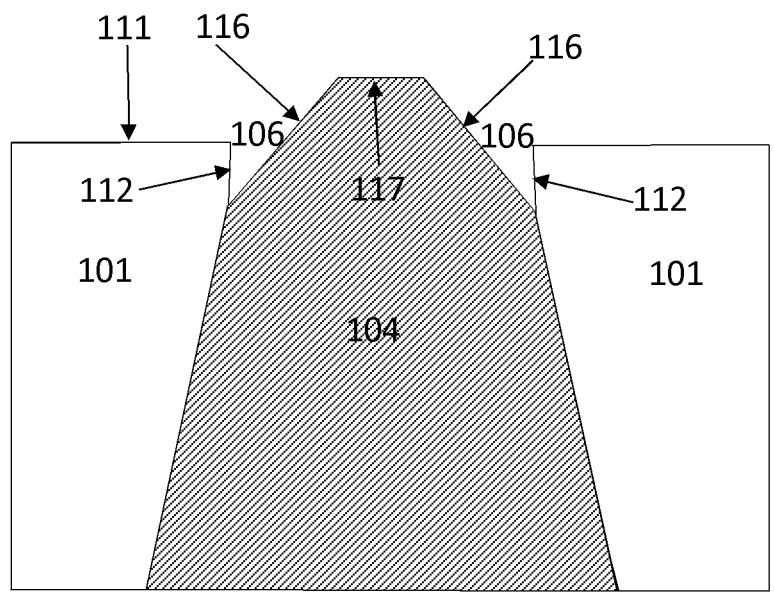
Figure 10:
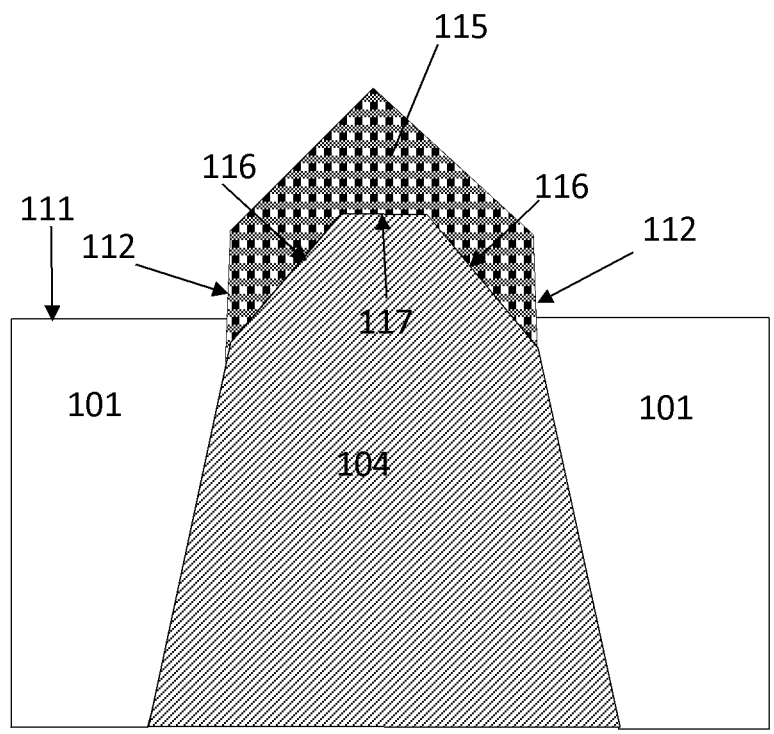

In embodiments where a plurality of nanostructures, e.g., two nanostructures 105a, 105b are provided (FIGS. 7,8), the nanostructures may be formed using the manufacturing steps described with respect to FIGS. 9 and 10, according to embodiments.

Referring to FIG. 9, after providing the semiconductor fin (comprising the second crystalline semiconductor material) of FIG. 5, the semiconductor fin (comprising the second crystalline semiconductor material) is subjected to a heat treatment step, according to embodiments. The heat treatment step can be performed, e.g., at a temperature between about 400° C. and about 700° C. or between about 500° C. and 600° C. In some embodiments, the heat treatment step may be carried out in an environment using, e.g., tertiarybutylarsine (TBA) or tertiarybutylphosphine (TBP) in a carrier gas comprising hydrogen $H_2$ for about 1 to 5 minutes.

In some embodiments, the heat treatment may be a prebake step which causes a reflow of the second crystalline semiconductor material or a thermal etching of the second crystalline semiconductor material. In other embodiments, the thermal treatment may cause evaporation and redeposition of the second crystalline semiconductor material. Such reflow and/or evaporation/redeposition can cause formation of faceted top surface 116 of the second crystalline semiconductor material. Under certain circumstances, the heat treatment also causes formation of a gap, a groove, or a recess 106 between the STI sidewall 112 and the now faceted top surface 116 of the second crystalline semiconductor material. The middle part of the top surface 117 of the second crystalline semiconductor material of the semiconductor fin can be raised higher relative to the STI top surface 111. The gaps 106 are thus at a distance D from each other. The distance D is smaller than the width of the semiconductor fin measured near the top of the fin below the faceted surface 116, or smaller than half the width of the semiconductor fin measured at the top of the fin below the faceted surface 116, according to some embodiments.

Referring to FIG. 10, after the heat treatment described above with respect to FIG. 9, the gaps 106 are at least partially filled with the third crystalline semiconductor material 115, according to embodiments. In some embodiments, the gaps 106 may be filed completely. The third crystalline semiconductor material 115 can be grown, e.g., epitaxially grown on the second crystalline semiconductor material, where the growth commences on the (reflown) faceted top surface 116 of the second crystalline semiconductor material (FIG. 9). In some embodiments, the third crystalline semiconductor material can be grown selective-epitaxially grown on the second crystalline semiconductor material such that no substantial growth occurs on the surfaces of the surfaces of the STI regions 101. In embodiments, the third crystalline semiconductor material 115 grows in the gaps 106 and can also grow above the top surface 117 of the second crystalline semiconductor material. The overgrown third crystalline semiconductor material may be removed by a CMP step thereby resulting in a structure as schematically shown in FIG. 8 comprising two nanostructures 105a, 105b of third crystalline semiconductor material that are separated by a distance D from each other. The third crystalline semiconductor material 115 is chemical-mechanically polished at least down to the top surface 117 according to some embodiments, but may also be continued until reaching a level below the initial level of the top surface 117 according to some other embodiments.

It will be appreciated that, if the distance D between the two nanostructures is less than the thickness of the gate stack layers, the two nanostructures will merge.

If the top surface 117 of the second crystalline semiconductor material does not extend above the STI top surface 111, different configurations are possible to ensure that the nanostructures will be suspended. One possibility is to perform a CMP step to just below the top surface 117 thereby creating a break between the two nanostructures. Another possibility is to perform a partial STI oxide etch before the thermal treatment step such that the STI top surface 111 is lowered. After the thermal treatment the top surface 117 of the second semiconductor material will be above the lowered STI top surface 111. By using a CMP step to remove part of the third semiconductor material which selectively stops on the STI oxide, the two nanostructures may be suspended.

Figure 11:
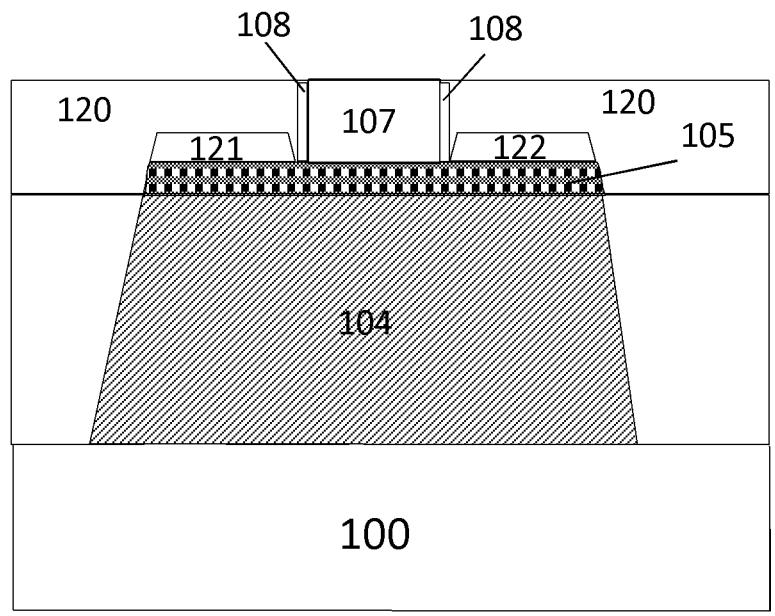
FIGS. 11 to 13 and FIG. 16 schematically illustrate intermediate semiconductor structures at various different processing stages according to a method of manufacturing a gate-all-around semiconductor device comprising at least one nanostructure, according to embodiments of the present disclosure.

Referring now to FIG. 11, a sacrificial gate 107 is provided on the at least one nanostructure 105 (FIG. 6) and a source/drain region is formed on the at least one nanostructure 105 adjacent the sacrificial gate. Unlike FIGS. 1-10, in which the illustrated intermediate structures show cross sections of the fins made along a direction of the width of the fins, in FIG. 11, the illustrated cross-section of the fin 104 is made along a direction of the length of the fins.

FIG. 15 shows a top or plan view of the semiconductor device after the sacrificial gate has been provided. In FIG. 15, for illustrative purposes, different embodiments are shown in a single device. The nanostructure 105 (left 105) corresponds to the nanostructure 105 of FIGS. 6 and 7 after formation of a sacrificial gate, and the plurality of nanostructures 105a/105b (right) correspond to nanostructures 105a, 105b of FIG. 8 after formation of a sacrificial gate. It will be appreciated, however, that only one of the two types of nanostructures 105 or 105a/105b can be implemented. In the following with respect to FIGS. 11-13, formation of a gate structure is illustrated with respect to the nanostructure 105, for illustrative purposes. However, the processes can similarly be applied to formation of gate structures with respect to nanostructures 105a/105b.

Referring back to FIGS. 11 and 12, a sacrificial gate 107 is provided on top of the nanostructure 105. A dielectric layer 120 is also provided. As described above, FIGS. 1 to 10 correspond to cross-sections of the fins made along a direction of the width of the fins (along the A-A' cross-section in FIG. 15), whereas FIGS. 11 to 12 correspond to cross-sections of the fins made along a direction of the length of the fins (along the B-B' cross-section in FIG. 15). A sacrificial gate 107 may be provided using suitable techniques for providing a gate layer on the at least one nanostructure and patterning this gate layer to form a sacrificial gate 107. Spacers 108 are processed or provided at the side surfaces of the sacrificial gate 107. After sacrificial gate and spacer formation source 121 and drain 122 regions may be provided. This may for example be done by epitaxially growing a fourth semiconductor material on the at least one nanostructure, for example, growing an in-situ doped fourth semiconductor material. For isolation of the sacrificial gate and source/drain regions a dielectric material 120 (interlayer dielectric ILD) is provided on the structure.

Figure 12:
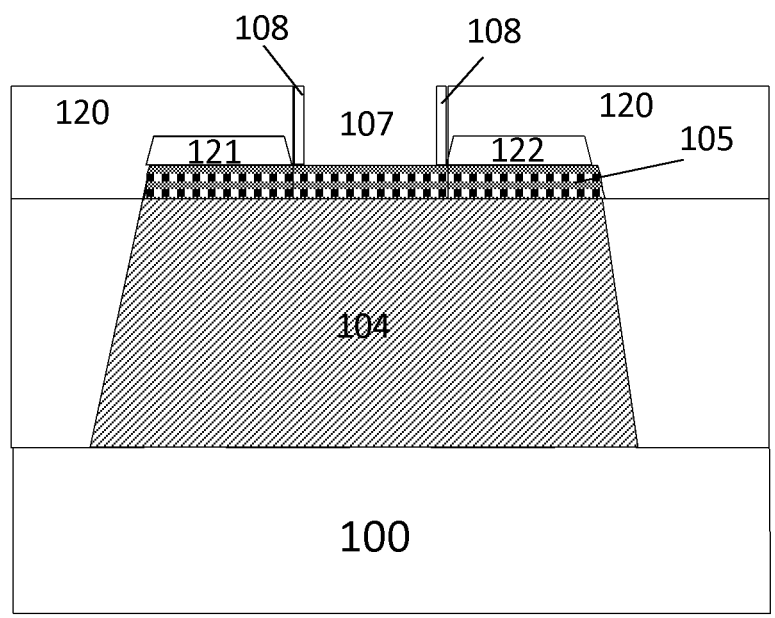

After providing the sacrificial gate 107, the spacers 108 and the source/drain regions 121, 122, the sacrificial gate 107 is removed (FIG. 12). Removal of the sacrificial gate 107 may be done by etching. By removing the sacrificial gate middle part of the at least one nanostructure is revealed, whereas the outer parts of the at least one nanostructure are connected/contacted to the source and drain regions 121, 122.

In the following, processes whereby the nanostructures are suspended by the source/drain regions and possibly additionally by the ILD layer 120 are described, instead of being suspended by the STI regions 101. In the resulting illustrated embodiment, the source/drain regions are thereby encased by the ILD layer 120.

Figure 13:
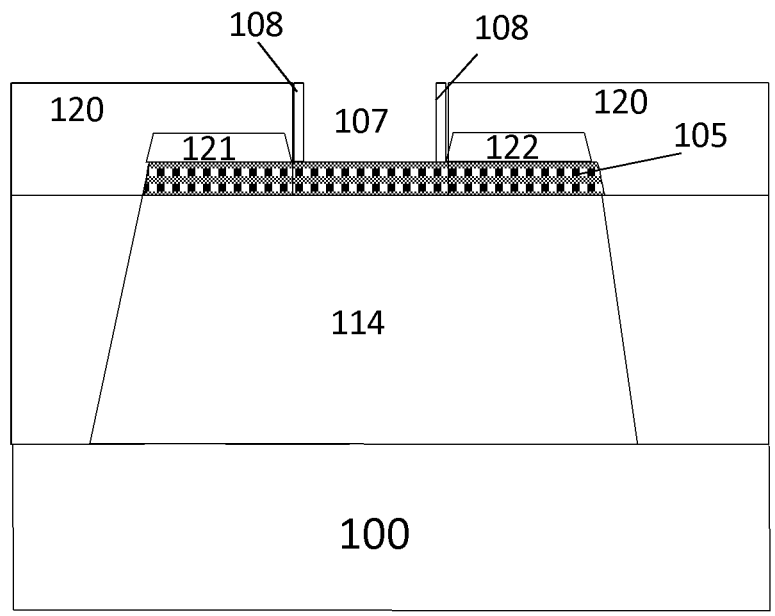
Figure 14:
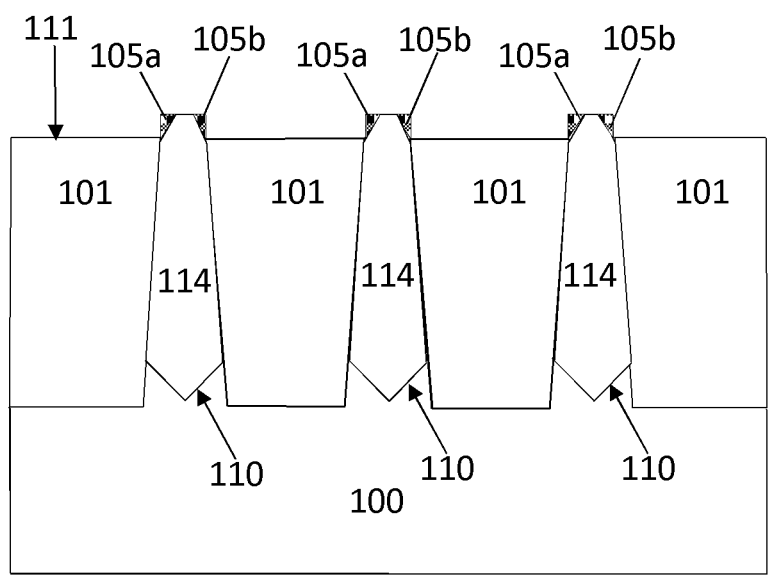

Referring to FIGS. 13 and 14, after removal of the sacrificial gate 107, the second crystalline semiconductor material 104 is removed thereby suspending the at least one nanostructure (FIGS. 13, 14). The at least one nanostructure 105, 105a, 105b is thus suspended above an empty trench 114 formed by removing the second semiconductor material, and the nanostructure 105 or the nanostructures 105a/105b are held in place by the source and drain regions 121,122. The second crystalline semiconductor material may be removed by etching, e.g., selectively etching, using an etch chemistry that is selective against the third semiconductor material. For example, a second semiconductor material comprising InP buffer layer may be etched using HCl, which is highly selective against a third semiconductor material comprising InGaAs as the channel material (nanostructure 105 or nanostructures 105a/105b). FIG. 13 shows a cross-section along the B-B' line and FIG. 14 along the A-A' line after removal of the second crystalline semiconductor material 104. A cavity or empty space 114 is thus created under the at least one nanostructure 105.

By removing the second crystalline semiconductor material 105 underneath the third crystalline semiconductor material the main leakage path is eliminated. Moreover a GAA device maybe fabricated by exposing the nanostructure.

Figure 16:
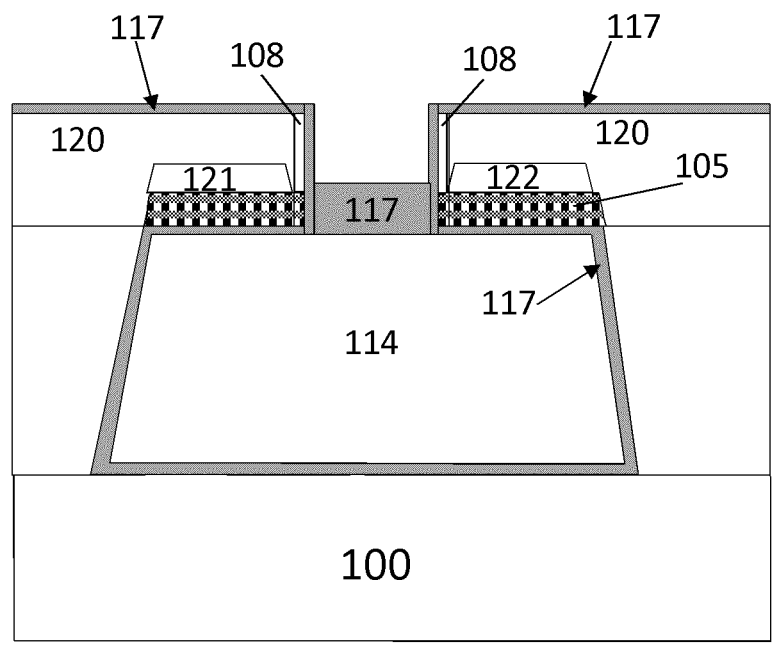
Figure 17:
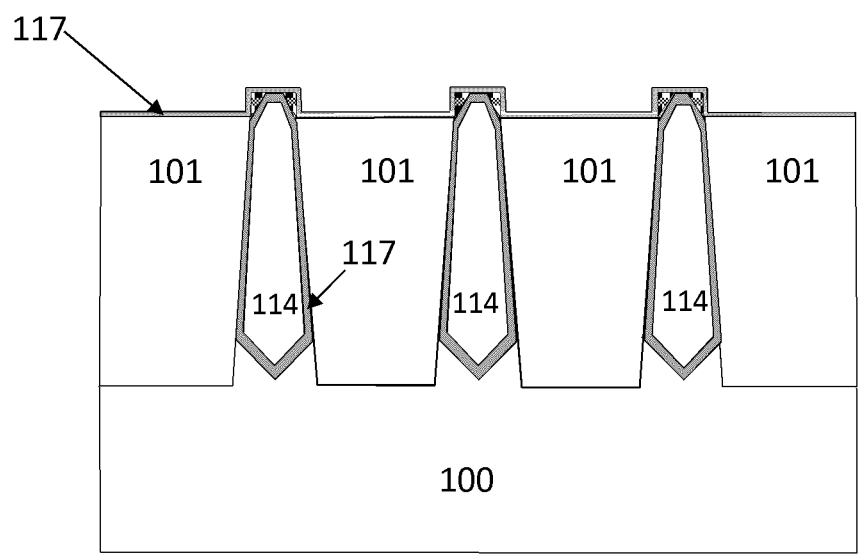
FIGS. 17 and 29 schematically illustrate a gate-all-around semiconductor device comprising one nanostructure according to embodiments of the present disclosure.
Figure 18:
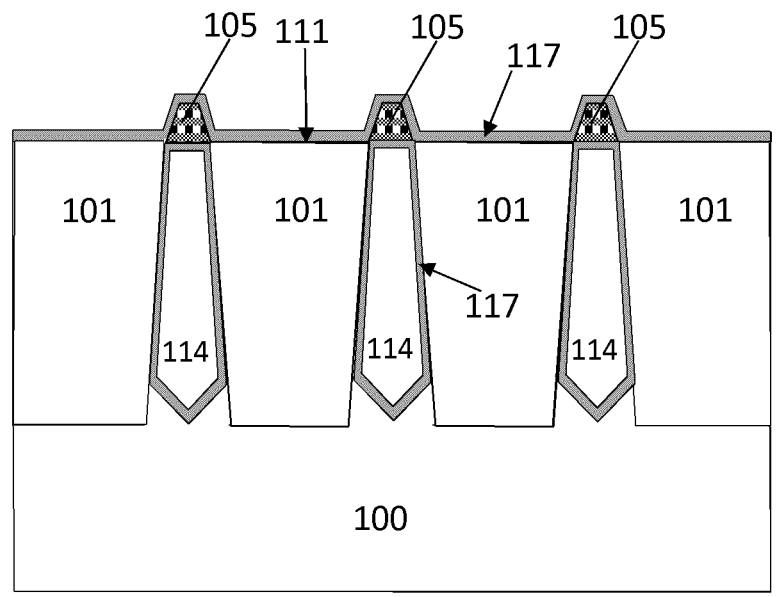
FIG. 18 schematically illustrates a gate-all-around semiconductor device comprising two nanostructures according to embodiments of the present disclosure.

Referring to FIGS. 16-18, after removing the second crystalline semiconductor material 104 and thereby suspending the nanostructure 105 or the nanostructures 105a/105b, a final gate stack 117 may be provided, according to embodiments. The final gate stack 117 includes at least one gate dielectric and at least one gate metal and surrounds at least portions of the nanostructure 105 or nanostructures 105a/105b. That is, at least the free-standing portions of the nanostructure 105 or the nanostructures 105a/105b, from which the sacrificial gate 107 and the second semiconductor material 104 are removed, are circumferentially surrounded by the gate stack. Referring to FIG. 16 for a side view along the B-B' cross-section and to FIG. 17 (two nanostructures on each fin 104) and FIG. 18 (one nanostructure on each fin 104) for a side view along the A-A' cross-section, the final gate stack 117 is shown. The final gate stack is preferably provided using a deposition technique such as atomic layer deposition (ALD) such that the layers are provided conformally on the different device components. It is seen from FIGS. 16 and 17 that the final gate stack is formed at the exposed sidewalls of the STI regions 110 in the cavity 114, around the at least one nanostructure 105, 105a, 105b, at the sidewall of the spacers 108 and at the top surface of the dielectric layer 120.

Figure 20:
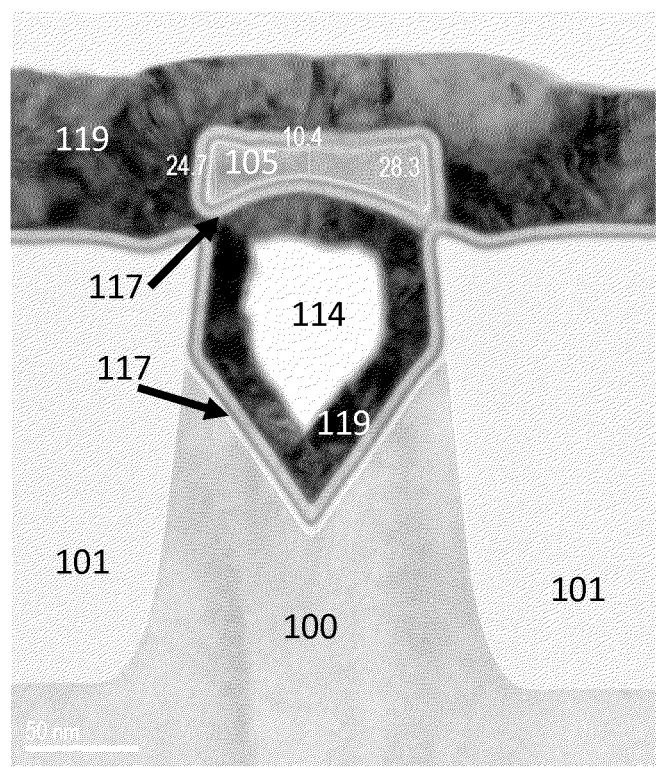

After providing the final gate stack 117, the device may be finalized with the metallization step comprising tungsten gate fill 119 and CMP, contact formation and further back-end-of (BEOL) line processing (see FIG. 20).

EXPERIMENTAL RESULTS

InGaAs GAA and lateral nanowire devices have been fabricated according to embodiments of the present disclosure. The replacement fin process has been used on 300 mm Si substrates. For a gate length ($L_G$) of 60 nm an extrinsic transconductance ($g_m$) of 1030 µS/µm at a drain/source voltage ($V_{ds}$) of 0.5 V is achieved which is an increase of almost 2 times compared to the replacement fin FinFET process. This improvement is attributed to the elimination of Mg counterdoping in the GAA flow. Nanowires with diameters of 6 nm were demonstrated to show quantization induced immunity to interface trap density ($D_{it}$) resulting in a saturated subthreshold slope ($SS_{SAT}$) of 65 mV/dec for 85 nm $L_G$ devices.

GAA Device Fabrication and Device Results

The process flow for fabricating a InGaAs GAA device comprises summarized the following sequence:
 InGaAs fin formation
 Sacrificial gate patterning
 Spacer processing
 Si doped InAs S/D deposition
 ILD0 deposition and CMP
 Sacrificial gate removal
 InP buffer removal
 High-k and metal gate deposition
 W gate fill and CMP
 Contact and metal 1

The InGaAs fin is first formed using a replacement fin approach up to the point of the replacement metal gate (RMG) module on 300 mm Si substrates. After the sacrificial gate removal only the part of the fin directly under the gate line is revealed (FIG. 12). A cross-section along (B-B') and across (A-A') the trench is shown in FIG. 12 and FIG. 7 respectively before InP removal and in FIG. 14 and FIG. 13 respectively after InP removal.

Figure 19:
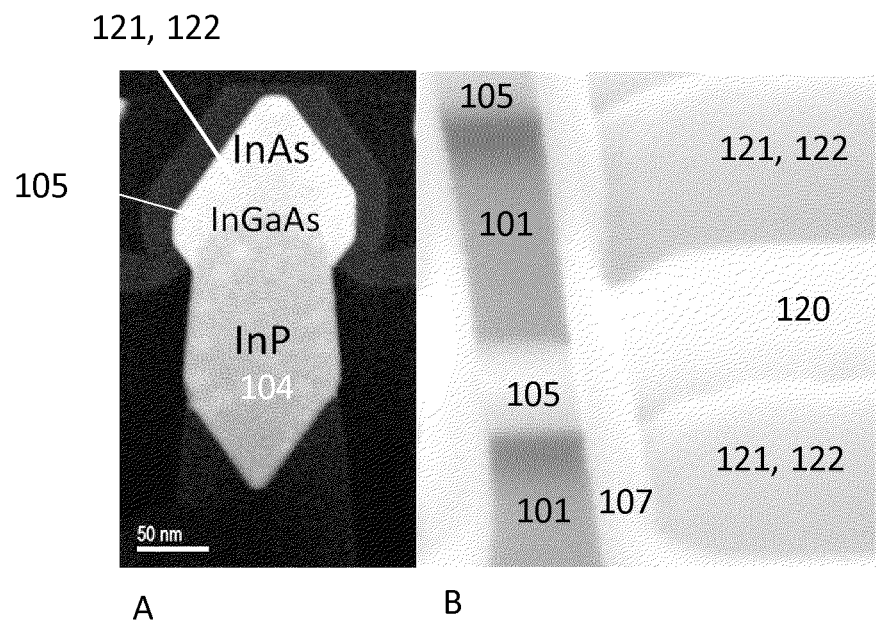
FIGS. 19 and 20 show a secondary electron microscopy (SEM) image of a gate-all-around semiconductor device comprising one nanostructure, according to embodiments of the present disclosure.
Figure 21:
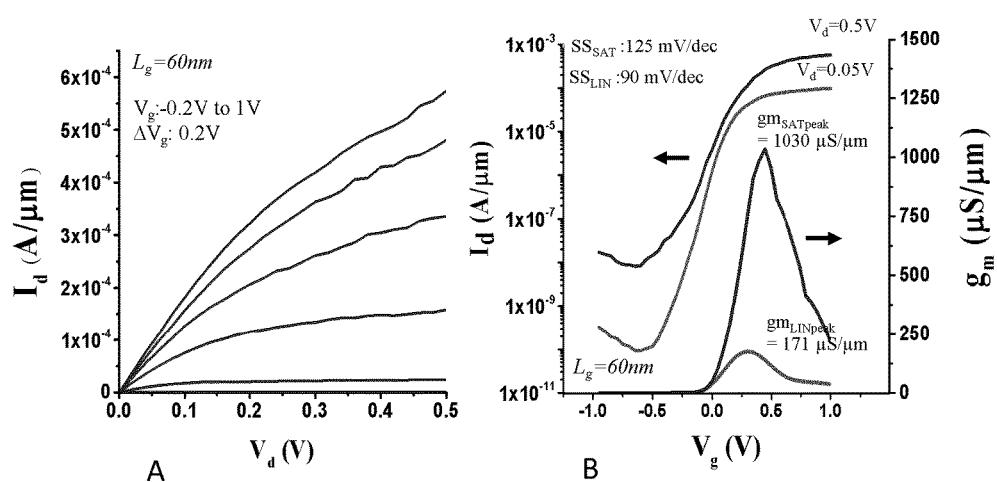
FIGS. 21 to 25 show experimental results relating to the device characteristics of a gate-all-around semiconductor device comprising at least one nanostructure, according to embodiments of the present disclosure.
Figures 22, 23, 24:
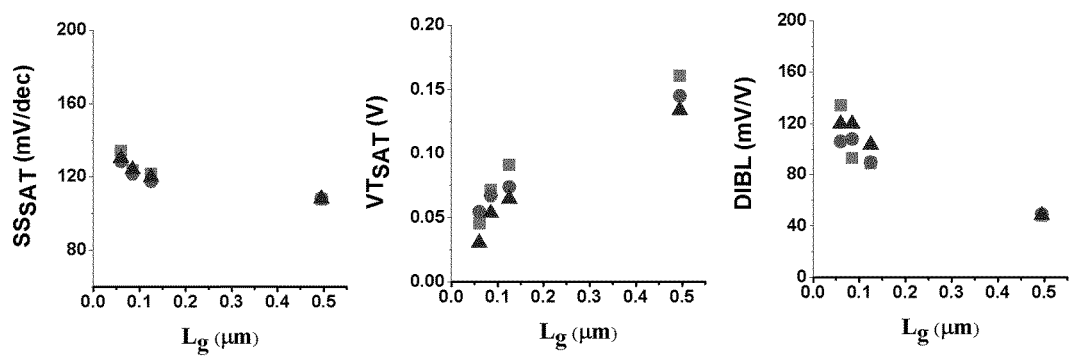
Figure 25:
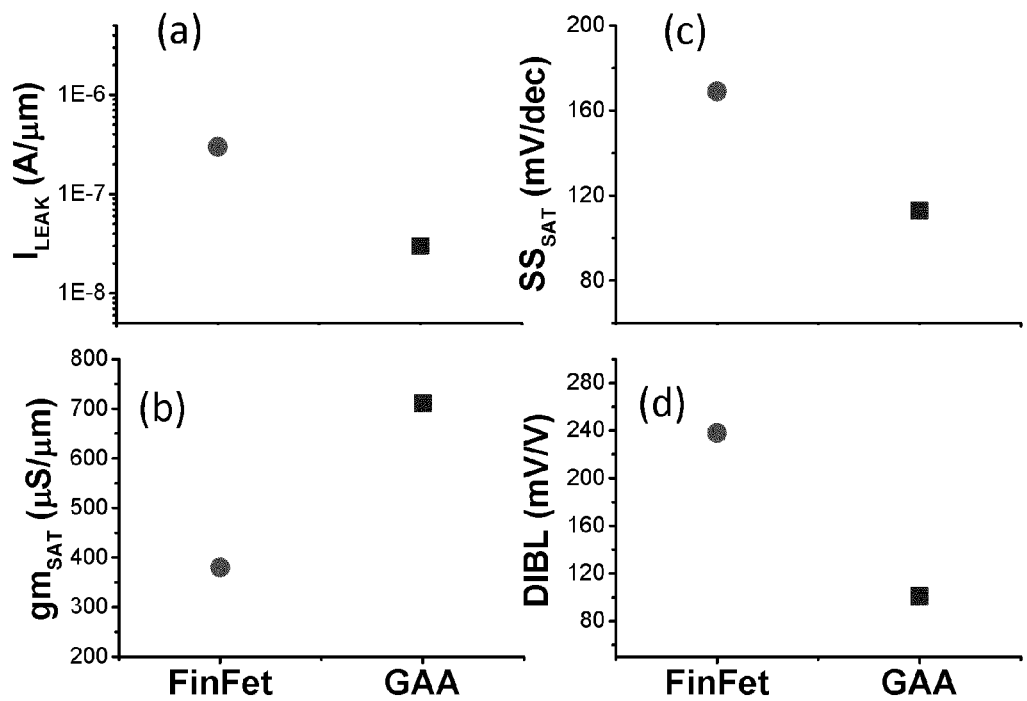

For the replacement fin approach, metal organic vapour phase epitaxy (MOVPE) is used for the III-V growth in order to be compatible with high-throughput processing. However, the carbon that is inherently present in the metal organic precursors (TBP, TBAs, TMIn and TMGa) causes unintentional n-type doping of the InP and InGaAs layers. To counteract this background doping, a p-type Mg doping solution is developed. While the Mg doping was effective in suppressing the off-state source drain leakage current a trade-off is found between the Mg doping level and the channel mobility. Ultimately, the doping induced mobility reduction limits the device performance achievable. From this perspective a GAA architecture is extremely attractive for the InP/InGaAs system. By removing the n-type InP buffer layer from underneath the InGaAs channel the main leakage path is eliminated without the penalty of reduced mobility The STI fin recess is sufficiently deep to expose the InP buffer layer and $HCl:H_2O$ is used to selectively etch the InP with respect to the InGaAs channel. This results in an InGaAs channel layer being suspended above the now empty trench and held in place by the N+InAs source/drain (SD) layer (FIG. 19, 20) which is encased by the inter layer dielectric (ILD) stack. The high-k gate stack of 2 nm $Al_2O_3$/2 nm $HfO_2$/3 nm TiN is deposited by ALD. The high-k gate stack has an equivalent oxide thickness (EOT) of 1.5 nm. Processing is then completed by W gate fill and CMP followed by standard W-plug contact and metal 1 (M1) modules. A TEM of a completed 95 nm wide GAA InGaAs device is shown in FIG. 20, which is comparable to the schematic presentation in FIG. 18. Here it is clearly seen that the InP buffer has been fully removed and the channel comprises a block of InGaAs that is wrapped all around by the gate stack. I-V characteristics of a 60 nm $L_G$ device with a channel width of 95 nm and a maximum thickness of 30 nm at different gate voltages (0.2V lower line in steps of 0.2V to 1 V upper line) are shown in FIG. 21A. The InGaAs shape is rounded due to the reflow of the InP during the pre-bake step of the InGaAs deposition. A peak extrinsic $g_m$ of 1030 µS/µm is achieved with a SS of 125 mV/dec at $V_{ds}$=0.5V (FIG. 21B). SCE as a function of channel width and gate length are shown in FIGS. 22 to 24. FIG. 22 shows the saturated subthreshold slope (SSat) as a function of gate length Lg and width W. FIG. 23 shows the saturated threshold voltage (VTsat) as a function of gate length Lg and width W. VT is defined at a drain current Id equal to 1 µA/µm. FIG. 24 shows drain-induced barrier lowering DIBL as a function of gate length Lg and width W. Width W in FIGS. 22, 23 and 24 is varied from 55 nm (rectangles) to 75 nm (circles) to 95 nm (triangles). Threshold voltage ($V_T$) roll-off and degradation of SS and DIBL is observed as the $L_G$ is scaled from long to short channel. The channel widths are too large with respect to the channel thickness (15-27 nm) to have a large impact. It is expected that more aggressive scaling of the width and EOT will yield further improvements. The performance of the GAA devices (rectangles) is compared to that of the FinFET (circles) devices in FIG. 25A-D at a gate length of 125 nm and a same fin width of 55 nm. The increased electrostatic control of the GAA architecture results in a lower off state leakage despite the fact no counter-doping of the channel was employed. As expected both $SS_{SAT}$ and DIBL are also significantly improved. The near 2× improvement in $g_m$ obtained with the GAA flow is indicative of the improved transport properties of the channel due to the absence of Mg counterdoping.

Figure 26:
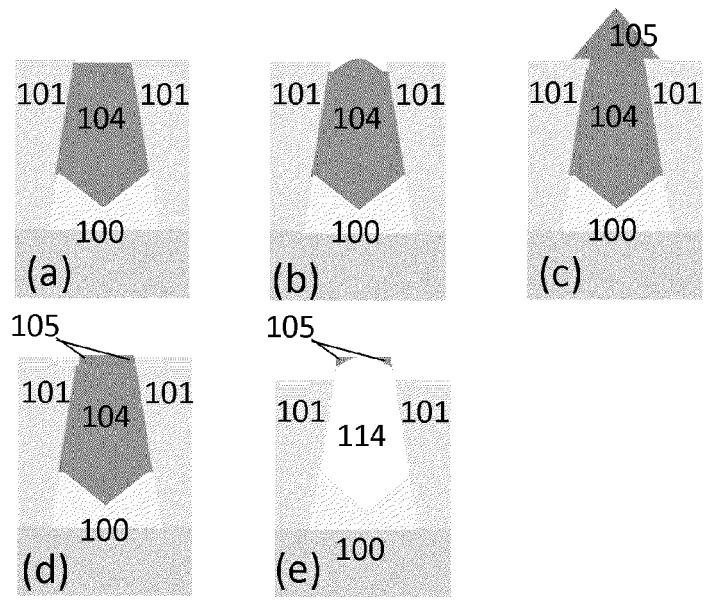
FIG. 26 schematically illustrates intermediate semiconductor structures at various different processing stages according to a method of manufacturing a gate-all-around semiconductor device comprising at least one nanostructure, according to embodiments of the present disclosure.
Figure 27:
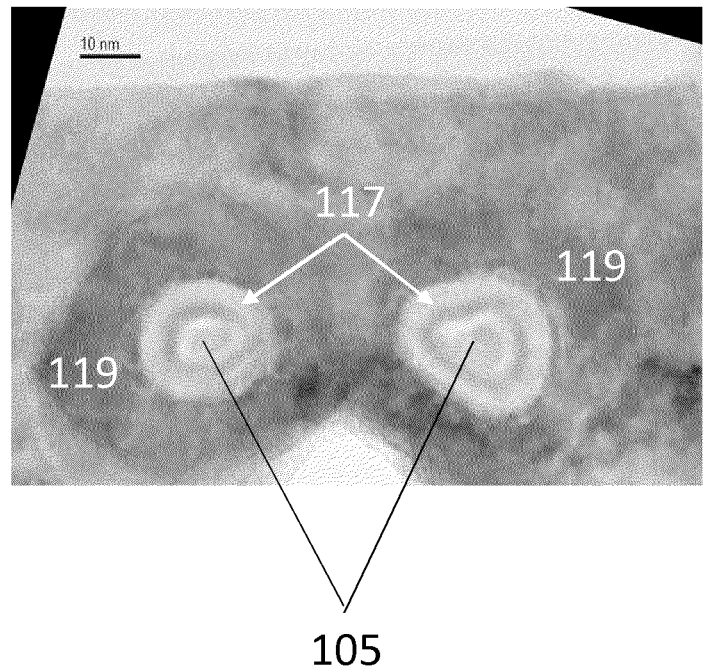
FIG. 27 shows a secondary electron microscopy (SEM) image of a gate-all-around semiconductor device comprising at two nanostructures, according to embodiments of the present disclosure.
Figure 28:
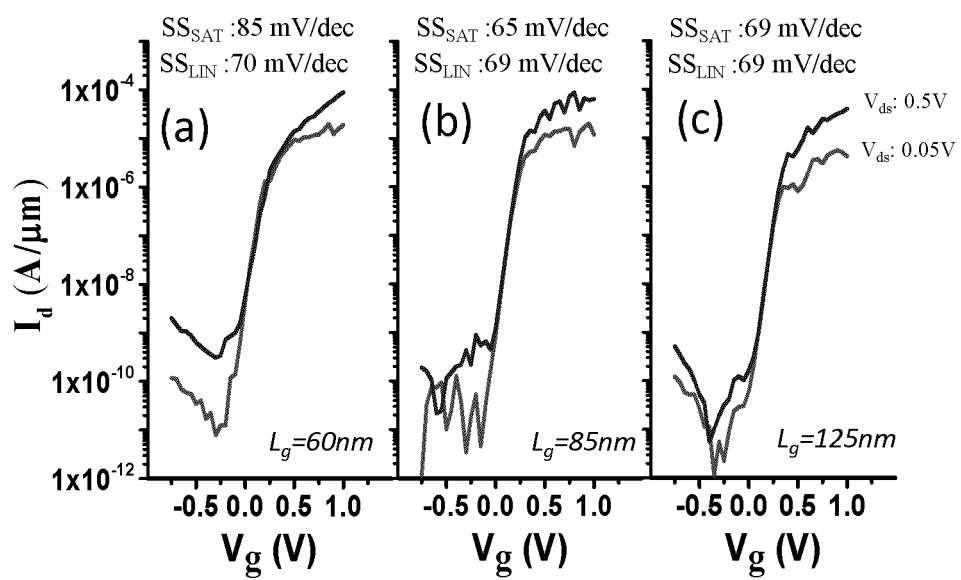
FIG. 28 shows experimental results relating to the device characteristics of a gate-all-around semiconductor device comprising two nanostructures, according to embodiments of the present disclosure.
Figure 29:
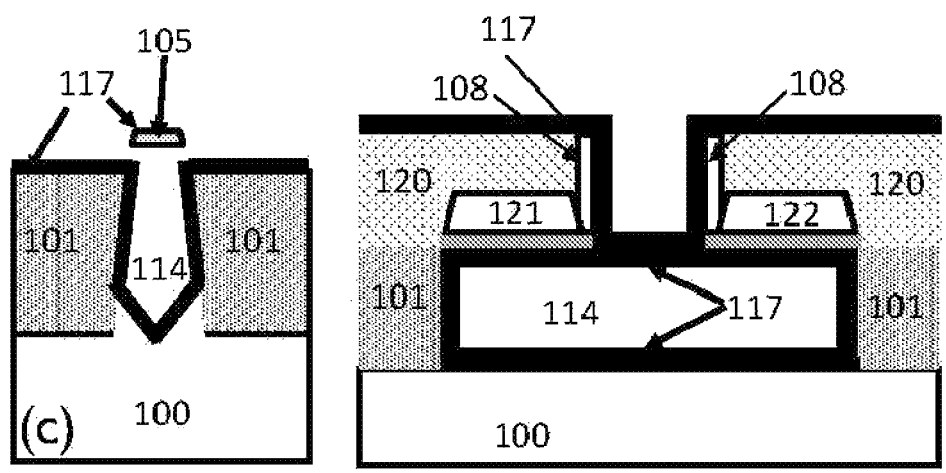
Figure 30:
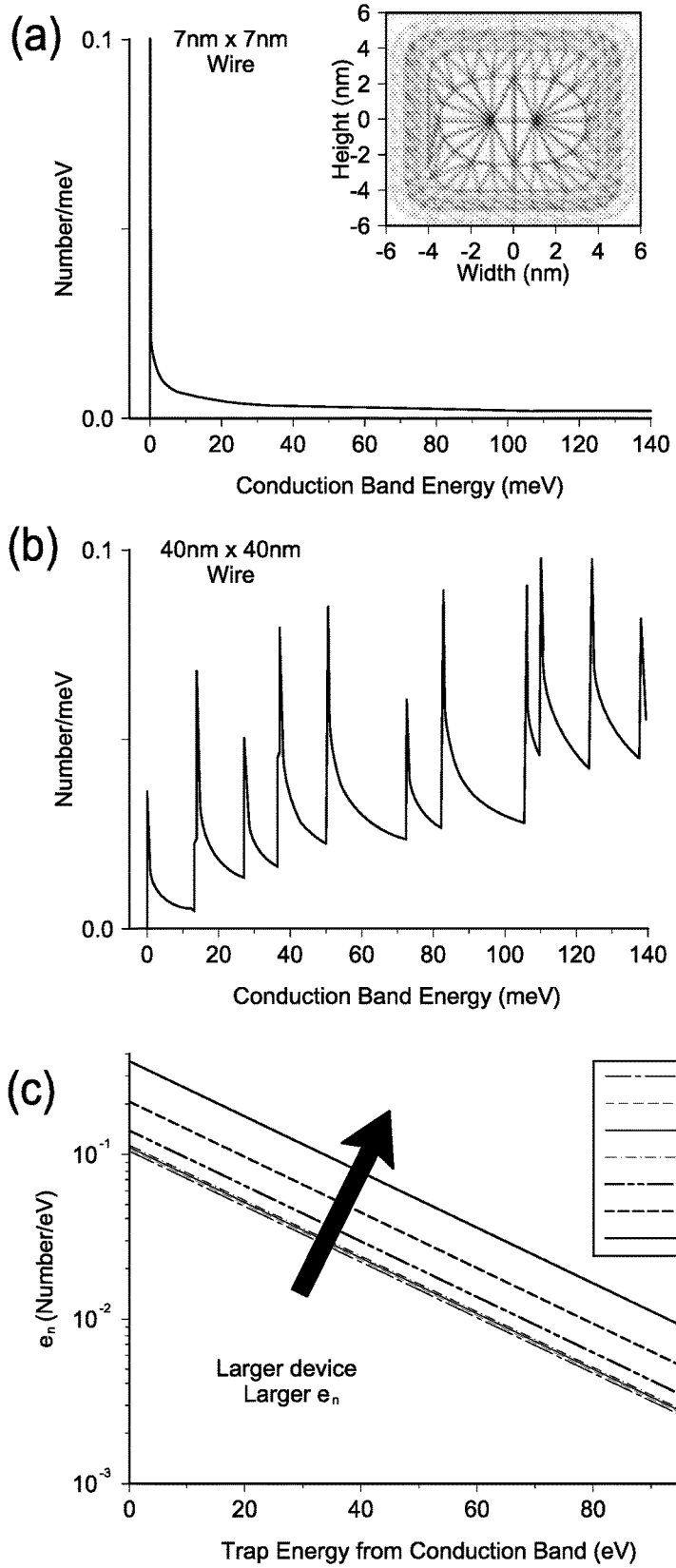
FIG. 30 shows simulation results relating to the device characteristics of a gate-all-around semiconductor device, according to embodiments of the present disclosure.

A modification of the fin process according to embodiments of the present disclosure is shown in FIG. 26. A dual nanowire channel and process steps for manufacturing such dual nanowire channel is shown. After a shallow InP-filled recess 104 is formed (a), a pre-bake before the InGaAs deposition results in a reflow (and rounding) of the InP buffer layer 104 (b). The gap created between the STI 101 sidewall and the now faceted InP 104 is subsequently filled with InGaAs 105 (c). After a CMP process of the InGaAs 105 (d), the STI 101 is recessed and the InP 104 is etched (e) to reveal the suspended nanowires 105a, 105b. If the InP recess is shallow enough after the channel CMP step only these two small regions of InGaAs (e) will remain which then become suspended nanowires after the InP removal (FIG. 26). This process is used to generate wires with diameters of only 6 nm. After suspending the nanowires a gate stack is provided as shown in FIG. 29 (which is an example of one nanostructure and comparable to the schematics in FIGS. 16 and 18). A high-k/TiN gate stack is provided around the InGaAs nanostructure and in the gap on the STI sidewalls. A SEM image of a dual nanowire fabricated according to a method of the present disclosure is shown in FIG. 27. A 4 nm and 6.5 nm wide InGaAs nanowire is fabricated surrounded by a TiN/HfO$_2$/Al$_2$O$_3$ gate stack. Remarkably, the $SS_{sAT}$ of short channel devices could be reduced to values as low as 65 mV/dec with negligible DIBL compared to the typical values of 120 mV/dec and 100-120 mV/V for the thicker GAA devices (FIG. 28). This improvement is attributed to a quantization induced immunity to Dit. However, the quantization also increases sensitivity to border traps in the high-k layer highlighting the need for a wide bandgap interlayer between the channel and high-k stack. Surface state traps should have a negligible impact on the SS of ultra-scaled GAA structures and this has been linked to the superior gate control of the small nanowire compared to the larger bulk like devices. To explore the effect of the band structure on the SS we use an 8 band k.p solver to study the impact of quantization effects on the thermionic emission rate ($e_n$) of the interface traps. The simulations show that the low DOS of highly confined structures compared to those of wires with relaxed dimensions effectively limits the emission rates of the traps (FIG. 30). This lower $e_n$ combined with the superior gate control results in the suppression of $D_{it}$ induced degradation in the nanowire device. The $I_{SAT}$ of the nanowire devices is also decreased which would be expected from the lower DOS, increased phonon scattering and effective mass associated with increased confinement. Quantization also results in an increase in the sub-band energy levels potentially allowing for a greater interaction of the channel charge with traps deeper in the high-K layer. Further investigation is needed to determine if optimization of the trap profile in the gate stack can boost the on performance While there has been illustrated or described what are presently considered to be example features, it will be understood by those skilled in the art that various other modifications may be made, or equivalents may be substituted, without departing from claimed subject matter. Additionally, many modifications may be made to adapt a particular situation to teachings of claimed subject matter without departing from central concept(s) described herein.

Therefore, it is intended that claimed subject matter not be limited to particular examples disclosed, but that claimed subject matter may also include all aspects falling within the possibility of appended claims, or equivalents thereof.

What is claimed is:

1. A semiconductor device comprising:
   a semiconductor substrate comprising a crystalline semiconductor material;
   at least one suspended nanostructure extending in a first direction and formed at least partially above and between a pair of adjacent STI regions, the at least one suspended nanostructure being electrically connected to and mechanically supported by a source region and a drain region formed at opposite ends of the at least one suspended nanostructure in the first direction, wherein the at least one suspended nanostructure comprises a crystalline semiconductor material that is different from the crystalline semiconductor material of the semiconductor substrate;
   a cavity formed vertically between the at least one suspended nanostructure and the semiconductor substrate and laterally between sidewalls of the STI regions facing each other; and
   a gate stack surrounding the suspended nanostructure, wherein the gate stack extends to cover a top surface and the sidewalls of the STI regions and an exposed surface of the semiconductor substrate in the cavity.

2. The semiconductor device of claim 1, wherein the at least one nanostructure includes only one suspended nanostructure with a width substantially equal to the width of the cavity.

3. The semiconductor device of claim 1, wherein the at least one nanostructure includes two suspended nanostructures at a distance D from each other, wherein D is larger than the thickness of the final gate stack and is smaller than the width of the cavity.

4. The semiconductor device of claim 1, wherein the crystalline semiconductor material of the substrate is Si and the crystalline semiconductor material of the at least one suspended nanostructure comprises a Group III-V material.

5. A semiconductor device, comprising:
   a semiconductor substrate having formed therein a cavity extending laterally in a first direction;
   at least one nanostructure elongated in the first direction above the cavity such that at least a portion of the bottom surface of the nanostructure does not contact the semiconductor substrate;
   a source layer and a drain layer formed above the semiconductor substrate and in contact with opposite end regions of the at least one nanostructure;
   a dielectric layer formed on and in contact with the source layer and the drain layer, such that the at least one nanostructure is mechanically supported by the dielectric layers contacting the source and drain layers; and
   a gate stack surrounding the nanostructure between the source layer and the drain layer, the gate stack including a gate dielectric layer and a gate metal layer.

6. The semiconductor device of claim 5, wherein the at least one nanostructure is formed of a different semiconductor material from the semiconductor substrate.

7. The semiconductor device of claim 6, wherein the source layer and the drain layer are formed of a different material from the at least one nanostructure and different from the semiconductor substrate.

8. The semiconductor device of claim 7, wherein the at least one nanostructure is formed of a Group III-V material.

9. The semiconductor device of claim 8, wherein the at least one nanostructure is formed of InGaAs.

10. The semiconductor device of claim 5, wherein the gate stack extends to cover surfaces of the cavity.

11. The semiconductor device of claim 5, wherein the at least one nanostructure consists of one nanostructure extending in the first direction between two adjacent shallow trench isolation regions.

12. The semiconductor device of claim 5, wherein the cavity has a fin shape extending in the first direction and has a width measured in a second direction perpendicular to the first direction that decreases continuously towards upper portions of the cavity from the bottom of the cavity.

13. The semiconductor device of claim 5, wherein the cavity has faceted bottom surfaces.

14. The semiconductor device of claim 5, wherein the at least one nanostructure includes two nanostructures separated from each other in a second direction perpendicular to the first direction.

15. The semiconductor device of claim 14, wherein the two nanostructures are separated by a distance that is greater than the thickness of the gate stack and is less than the width of the cavity in the second direction.

16. A semiconductor device, comprising:
a semiconductor substrate having formed therein a fin-shaped cavity extending laterally in a first direction;
a semiconductor nanowire comprising a channel region elongated in the first direction and formed above the cavity between a source layer and a drain layer, wherein the channel region does not contact the semiconductor substrate, and wherein the source layer and the drain layer are formed on an upper side of the semiconductor nanowire;
a gate stack surrounding the channel region, the gate stack including a gate dielectric layer and a gate metal layer, wherein the gate stack extends in the first direction to cover a lower side of the semiconductor nanowire below the source layer and the drain layer.

17. The semiconductor device of claim 16, wherein a dielectric layer is formed above the substrate and on each of the source layer and the drain layer, such that the semiconductor nanowire is mechanically supported by the source and drain layers and the dielectric layer, wherein the dielectric layer is separated in the first direction by a gap in which the gate stack surrounds the channel region.

18. The semiconductor device of claim 17, wherein the gate stack vertically extends to cover sidewalls of the gap in the dielectric layer.

19. The semiconductor device of claim 18, wherein a dielectric spacer layer laterally separates each of the source layer and the drain layer and the gate stack covering the sidewalls of the gap.

20. The semiconductor device of claim 19, wherein the semiconductor nanowire extends between two adjacent shallow trench isolation regions that contact the dielectric layer.

* * * * *